United States Patent
He et al.

(10) Patent No.: US 6,746,262 B2
(45) Date of Patent: Jun. 8, 2004

(54) SOCKET CONNECTOR WITH ACTUATOR MECHANISM MATING MEANS

(75) Inventors: Wen He, Kunsan (CN); Hui Ye, Kunsan (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/422,226

(22) Filed: Apr. 23, 2003

(65) Prior Publication Data

US 2004/0048508 A1 Mar. 11, 2004

Related U.S. Application Data

(63) Continuation-in-part of application No. 10/376,473, filed on Feb. 27, 2003.

(30) Foreign Application Priority Data

Sep. 9, 2002 (TW) ...................................... 91214021 U

(51) Int. Cl.[7] .............................................. H01R 13/62
(52) U.S. Cl. ...................................... 439/342; 439/259
(58) Field of Search ................................ 439/342, 259, 439/261, 262, 263, 265, 266, 267

(56) References Cited

U.S. PATENT DOCUMENTS

| | | | | |
|---|---|---|---|---|
| 5,057,031 A | * | 10/1991 | Sinclair | 439/261 |
| 5,489,218 A | * | 2/1996 | McHugh | 439/342 |
| 5,679,020 A | * | 10/1997 | Lai et al. | 439/342 |
| 5,722,848 A | * | 3/1998 | Lai et al. | 439/342 |
| 6,419,514 B1 | * | 7/2002 | Yu | 439/342 |
| 6,471,536 B1 | * | 10/2002 | Chen et al. | 439/342 |
| 6,638,093 B1 | * | 10/2003 | Chang | 439/342 |

FOREIGN PATENT DOCUMENTS

| | | |
|---|---|---|
| TW | 394472 | 6/2000 |
| TW | 443622 | 6/2001 |
| TW | 481375 | 3/2002 |
| TW | 481378 | 3/2002 |

OTHER PUBLICATIONS

U.S. patent application Ser. No. 10/376,473, He et al.
U.S. patent application Ser. No. 10/375,955, Yu.

* cited by examiner

*Primary Examiner*—Gary Paumen
*Assistant Examiner*—Briggitte Hammond
(74) *Attorney, Agent, or Firm*—Wei Te Chung

(57) ABSTRACT

A socket connector (1) for electrically interconnecting a CPU package and a PCB includes a base (2), a cover (3) slidably mounted on the base, an actuator mechanism (4) sandwiched between the cover and the base, and a plurality of terminals (5) received in the base. The base defines a first actuator channel (23) and an array of terminal-passages (221) for receiving the terminals therein. The cover defines a second actuator channel (32), corresponding to the first actuator channel. The first and second actuator channels form mating members (251, 33), respectively. The actuator mechanism includes a shaft (40), and a handle lever (41) extending perpendicularly from one end of the shaft. The shaft defines mating means (431, 432) mating with the mating members to keep the handle lever from unduly rotating.

17 Claims, 5 Drawing Sheets

SOCKET CONNECTOR WITH ACTUATOR MECHANISM MATING MEANS

This is a continuation-in-part application of a copending application Ser. No. 10/376,473 filed Feb. 27, 2003.

BACKGROUND OF THE INVENTION

1. Field of the Invention

The present invention relates to a socket connector, and more particularly to a central processing unit (CPU) socket connector for electrically interconnecting with a CPU package and a printed circuit board (PCB).

2. Description of the Prior Art

A typical socket connector is adapted to electrically interconnect with a PCB and an integrated circuit (IC) package, such as a CPU package. The socket connector includes a base mounted on the PCB, a cove mounting the CPU package thereon and slidably mounted on the base, a plurality of terminals received in the base, and an actuator mechanism embedded between the base and the cover. An array of terminal-passages is defined in the base, for receiving the terminals therein. An array of holes is defined in the cover corresponding to the terminal-passages, for insertion of pins of the CPU package. The cover is urged to an open place where the terminal-passages each is aligned with a corresponding hole, so that the pins of the socket connector are inserted into the corresponding terminal-passages with zero insertion force. After that, the cover is urged to a close place where the pins electrically engage with the corresponding terminals. The preceding description is abstracted from "Development of ZIF BGA Socket" (P16~P18, CONNECTOR SPECIFIER, May 2000). Thus good alignment between the holes and the corresponding terminal-passage is key to assuring insertion of the pins of the CPU package with zero insertion force, and avoid damage to the pins and the socket connector.

Similar socket connectors have also been disclosed in Taiwan Pat. Issue Nos. 481378, 481375, 394472 and 443622. As state above, the socket connector also comprises a base, a cover slidably mounted on the base, a plurality of terminals received in the base, and an actuator mechanism sandwiched between the cover and the base. A stopper block is formed on the base. An array of terminal-passages is defined in the base, for receiving the corresponding terminals therein. An array of holes is defined in the cover corresponding to the terminal-passages, for insertion of pins of a CPU package. The actuator mechanism includes a shaft, and a handle lever extending perpendicularly from one end of the shaft. Cam portions are formed in the shaft.

In assembling a CPU package onto the connector, the handle lever is operated to rotate the shaft, so that the cam portions of the shaft urge the cover into an open state. The stopper block stops a handle lever of the actuator mechanism at a vertical position. Thus the terminal-passages are aligned with the corresponding holes to assure insertion of the pins with zero insertion force.

However, the stopper block is exposed outside of the cover and the base. Thus the stopper block is easily damaged during assembly and use. Moreover, the stopper is situated at one end of the handle lever and adjacent an axis of the shaft, the other end of the handle lever traveling around the axis of the shaft. Therefore, when a little force is applied on the end of the handle lever, a great force will be generated against the stopper. The stopper is easily damaged by repeated operation. As a result, the terminal-passages are not aligned with the corresponding holes. The pins of the CPU package will not be inserted with zero insertion force, and may be damaged during insertion.

Thus, there is a need to provide an improved socket connector that overcomes the above-mentioned problems.

The aforementioned parent application Ser. No. 10/376,473 discloses some approach to solve the problem. The instant invention is an improvement thereupon. The copending application Ser. No. 10/375,955 with the same assignee, also discloses another approach to solve the problem.

SUMMARY OF THE INVENTION

Accordingly, one main object of the present invention is to provide an improved socket connector for electrically interconnecting a IC package with a PCB, wherein a actuator mechanism of the socket connector is accurately situated to assure insertion of pins of the IC package with zero insertion force during assembly and use.

To fulfill the above-mentioned object, a socket connector for electrically interconnecting a CPU package with a PCB is provided according to the present invention. The socket connector includes a base, a cover slidably mounted on the base, an actuator mechanism sandwiched between the cover and the base, and a plurality of terminals received in the base. A first actuator channel is defined in the base. An array of terminal-passages is defined in the base, for receiving the corresponding terminals therein. A second actuator channel is defined in the cover, corresponding to the first actuator channel. An array of holes is defined in the cover corresponding to the terminal-passages, for insertion of pins of the CPU package. First and second protrusion blocks are defined in the first and second actuator channels, respectively. The actuator mechanism includes a shaft, and a handle lever extending perpendicularly from one end of the shaft. Concavities are defined in the shaft, for respectively mating with the protrusion blocks to keep the handle lever from unduly rotating. Thus the pins of the CPU package can be safely inserted into the corresponding terminal-passages with zero insertion force, and damage to the cover and the base will be avoided while assembling and using.

Other objects, advantages and novel features of the present invention will become more apparent from the following detailed description when taken in conjunction with the accompanying drawings, in which:

DESCRIPTION OF PREFERRED EMBODIMENT OF THE INVENTION

Reference will now be made to the drawings to describe the present invention in detail.

Figure 1:
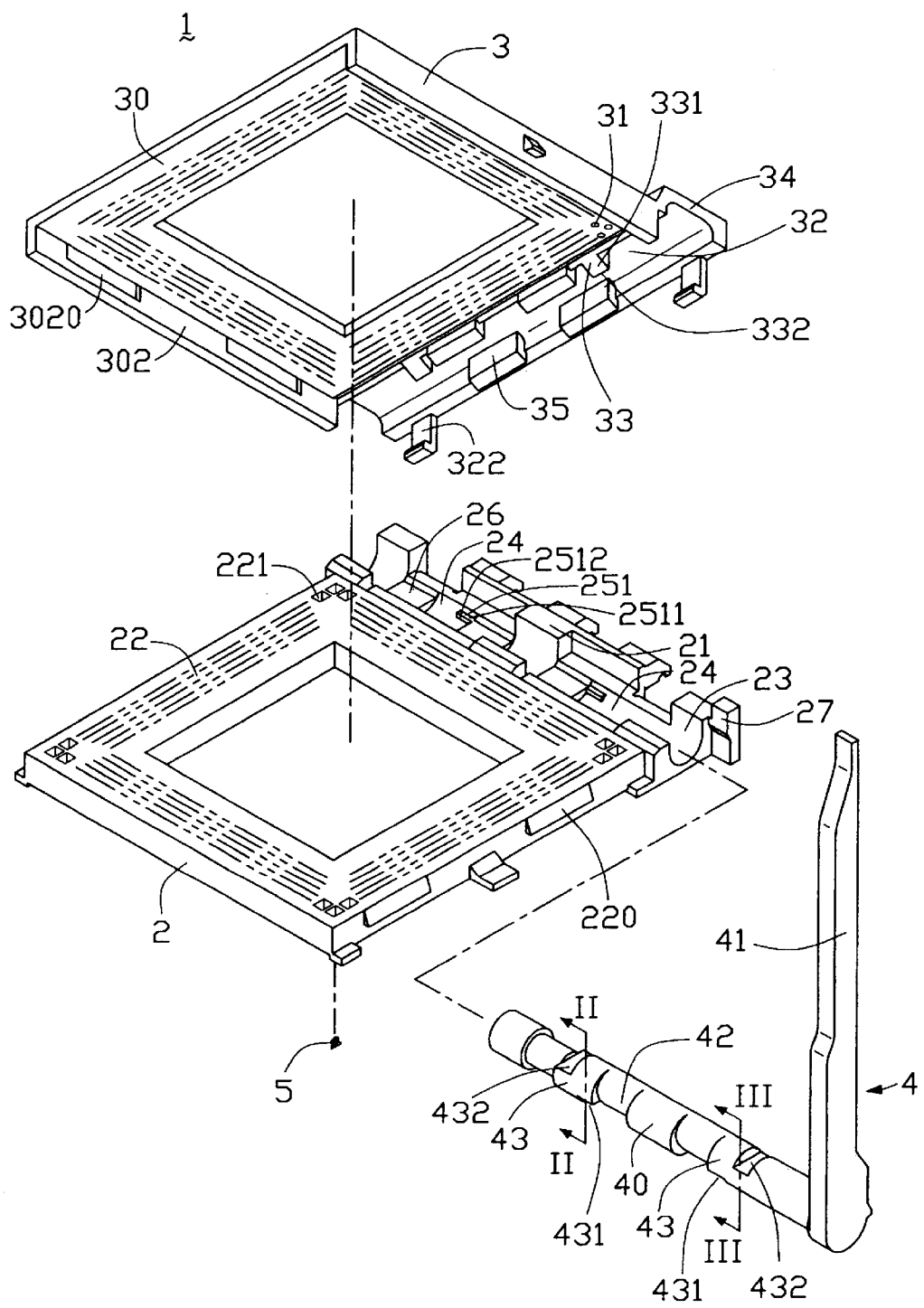
FIG. 1 is a simplified, exploded perspective view of a socket connector according to the present invention.
Figure 2:
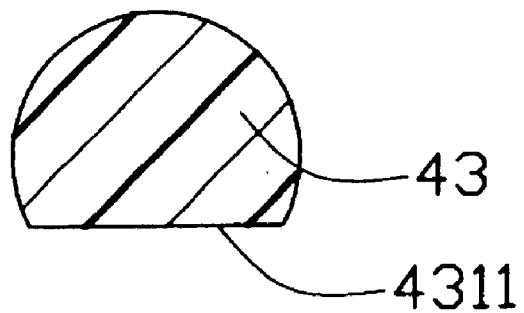
FIG. 2 is a cross-sectional view taken along line II—II of FIG. 1.
Figure 3:
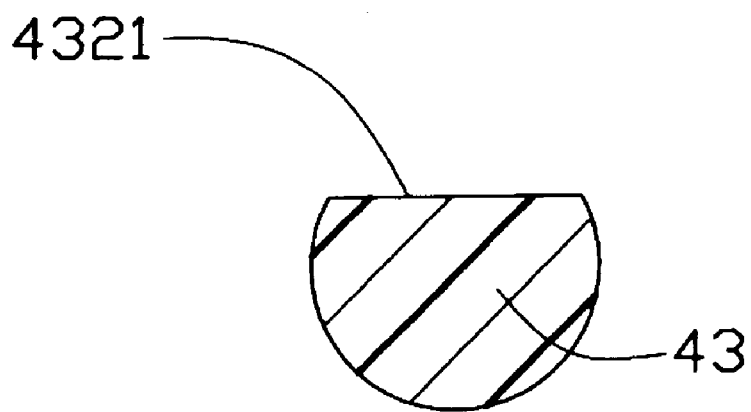
FIG. 3 is a cross-sectional view taken along line III—III of FIG. 1.

FIG. 1 shows a simplified, exploded perspective view of a socket connector 1 according to the present invention. The socket connector 1 is used to electrically interconnect a PCB and an IC such as a CPU package (not shown). The socket connector 1 comprises a base 2, a cover 3 slidably mounted on the base 2, an actuator mechanism 4 sandwiched between the cover 3 and the base 2, and a plurality of terminals 5 received in the base 2.

The base 2 is formed from dielectric materials such as LCP that can endure solder temperatures, and is substantially a rectangular substrate. The base 2 comprises a terminal receiving section 22, and a first actuator receiving section 21 extending from one end of the terminal receiving section 22. An array of terminal-passages 221 is defined in the terminal receiving section 22, for receiving corresponding terminals 5 therein. Four latching blocks 220 are provided at opposite lateral sides of the terminal receiving section 22 respectively.

A first actuator channel 23 is defined in the actuator receiving section 21, for pivotably securing the actuator mechanism 4 therein. First latching hooks (not labeled) are formed at a transverse side of the actuator receiving section 21. The first actuator channel 23 comprises trapezoidal actuating cavities 26 and arcuate positioning cavities 24 alternately disposed along a length thereof. Each positioning cavity 24 has first protrusion block 251 formed therein. First and second stopper surfaces 2511, 2512 are defined on the first protrusion block 251 parallel to a central axial line of the positioning cavities 24. The first and second stopper surfaces 2511, 2512 are perpendicular to each other. In addition, a stopper block 27 is provided at one side of the first actuator receiving section 21, for situating the actuator mechanism 4 at an open state (to be described hereinafter).

The cover 3 is also formed from dielectric materials such as LCP that can endure soldering temperatures, and is substantially a rectangular substrate. The cover 3 comprises a hole section 30 and a second actuator receiving section 34, respectively corresponding to the terminal receiving section 22 and the first actuator receiving section 21 of the base 2. An array of holes 31 is defined in the hole section 30 corresponding to the terminal-passages 221, for insertion of pins of the CPU package (not shown) therethrough. Two lateral side walls 302 depend from opposite lateral sides of the hole section 30. Each side wall 302 defines latching recesses 3020, for receiving the corresponding latching blocks 220 therein to mount the cover 3 on the base 2.

A groove-shaped second actuator channel 32 is defined in the second actuator receiving section 34, corresponding to the first actuator channel 23. Second latching hooks 322 depend from a transverse bottom edge of the second actuator receiving section 34, for respectively mating with the first latching hooks to mount the cover 3 on the base 2. The second actuating receiving 32 is formed with actuating plates 35 at opposite long sides thereof. Second protrusion blocks 33 are formed at one long side of the second actuating receiving 32. Each second protrusion block 33 is configured with first and second mating surfaces 331, 332. The first and second mating surfaces 331, 332 are perpendicular to each other, and parallel to the central axial line of the positioning cavities 24 when the cover 3 is mounted on the base 2.

Figure 4:
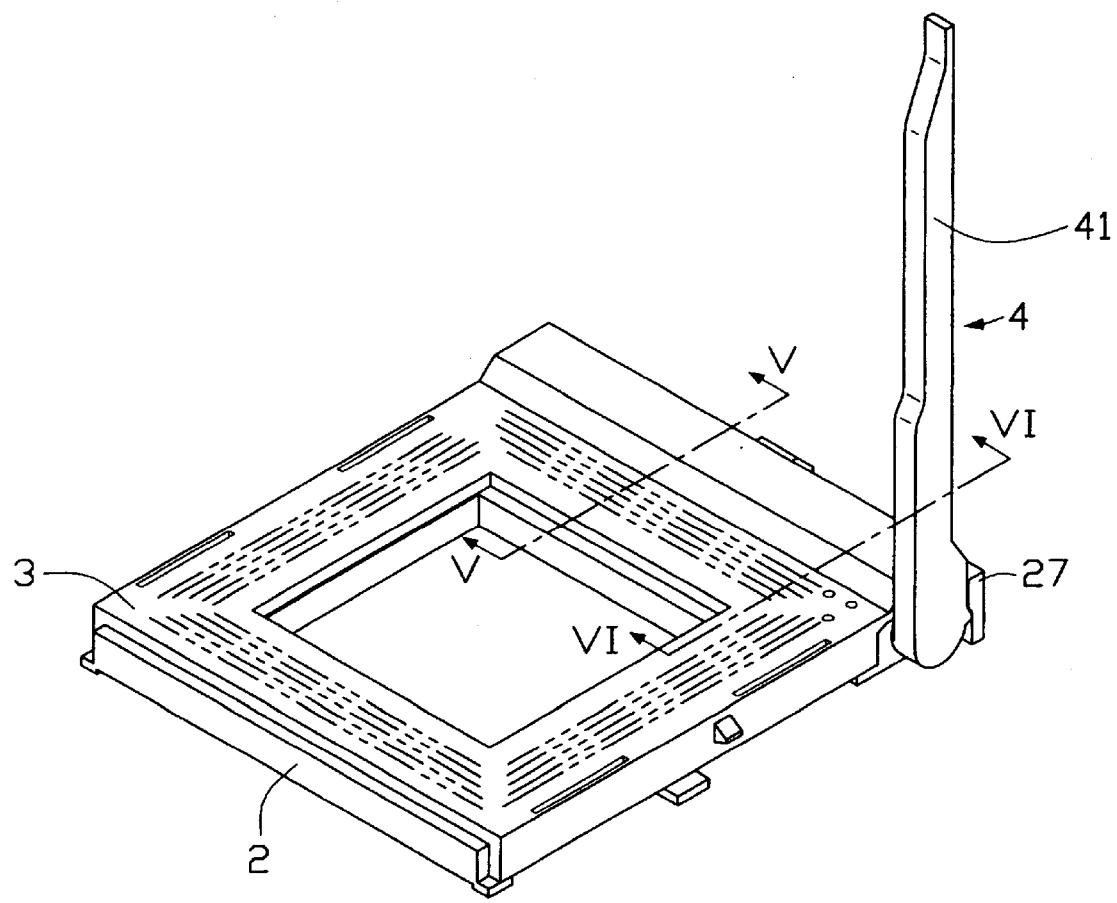
FIG. 4 is an isometric view of the socket connector, showing a cover of the socket connector at an open state.

Referring also to FIG. 4, the actuator mechanism 4 is pivotally sandwiched between the cover 3 and the base 2, and has a substantially "L"-shaped configuration. The actuator mechanism 4 comprises a shaft 40, and a handle lever 41 extending perpendicularly from one end of the shaft 40. Positioning portions 43 and cam portions 42 are formed on the shaft 40 in alternate fashion, for being received in the positioning cavities 24 and the actuating cavities 26 respectively. First and second concavities 431, 432 are defined at opposite sides of each positioning portion 43, corresponding to the first and second protrusion blocks 251, 33. First and second concavity stopper surfaces 4311, 4321 are defined at the first and second concavities 431, 432, the first and second concavity stopper surfaces 4311, 4321 being parallel to an axis of the shaft 40.

In assembly, the positioning portions 43 and the cam portions 42 are received in the actuating cavities 26 and the positioning cavities 24, respectively. Then the cover 3 is mounted on the base 2. The first latching hooks respectively ride over and snappingly engage with the second latching hooks 322. The latching recesses 3020 received the corresponding latching blocks 220. Thus the actuator mechanism 4 is pivotally sandwiched between the cover 3 and the base 2. The shaft 40 can rotate about its own axis in the first and second actuator channels 23, 32 by operating the handle lever 41. The cam portions 42 thereby respectively press on the actuating plates 35 to urge the cover 3 to slide relative to the base 2.

Figure 5:
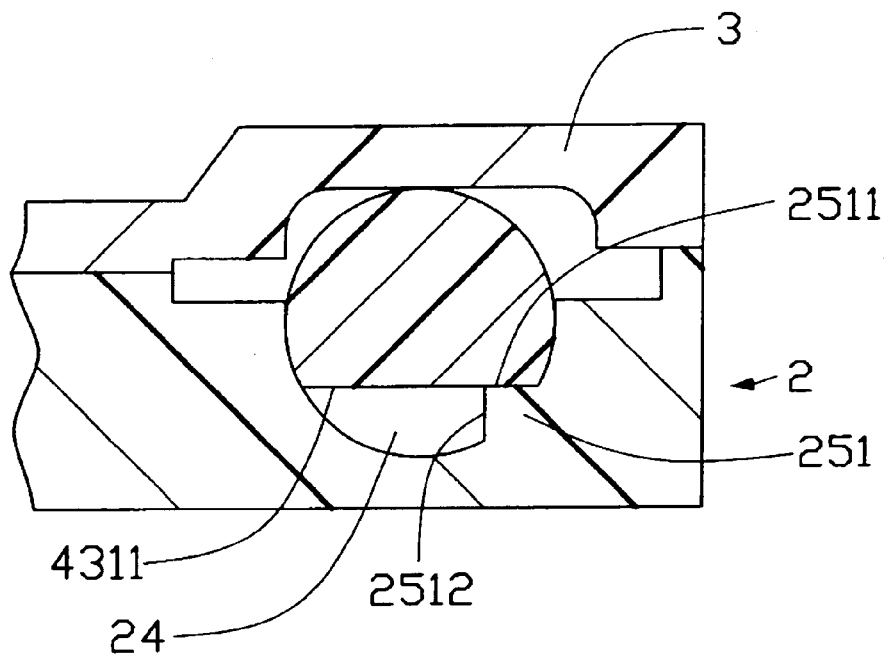
FIG. 5 is a cross-sectional view taken along line V—V of FIG. 4.
Figure 6:
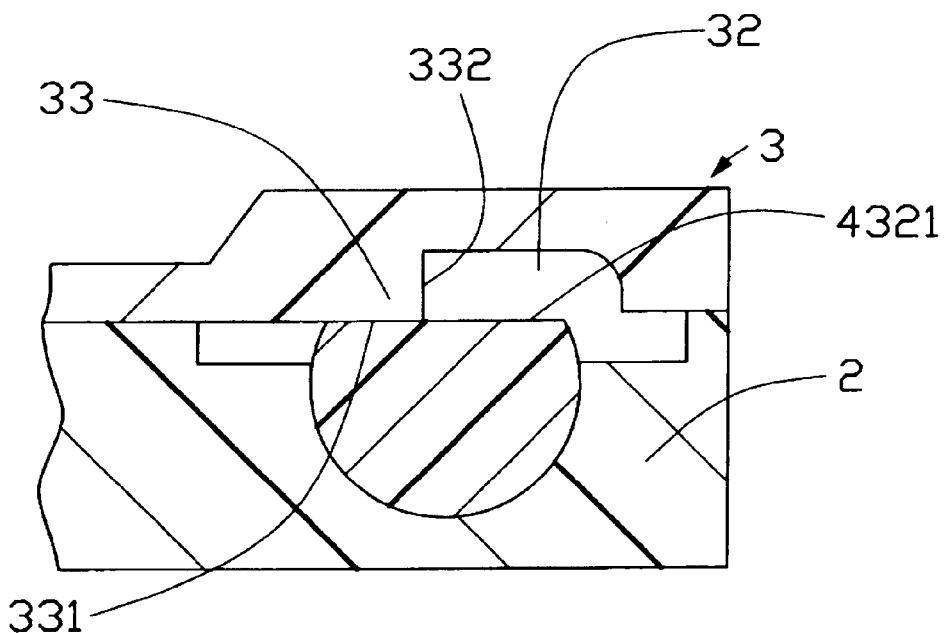
FIG. 6 is a cross-sectional view taken along line VI—VI of FIG. 4.

Referring to FIGS. 5 and 6, when the CPU package is mounted onto the socket connector 1, the cover 3 is urged to an open state where each terminal-passage 221 is aligned with the corresponding hole 31, and where the stopper block 27 stops the handle lever 41 at a substantially vertical position perpendicular to the cover 3. Additionally, the first and second concavity stopper surfaces 4311, 4321 respectively press on the first stopper surfaces 2511 of the first protrusion blocks 251 and the first mating surfaces 331 of the second protrusion blocks 33. The handle lever 41 is thereby prevented from being over-rotated, so that the cover 3 is firmly located at the open state. As a result, the pins are inserted in the terminal-passages through the corresponding holes accurately and safely. Zero insertion force of the pins is assured, and damage to the base 2 and the cover 3 is avoided.

Figure 7:
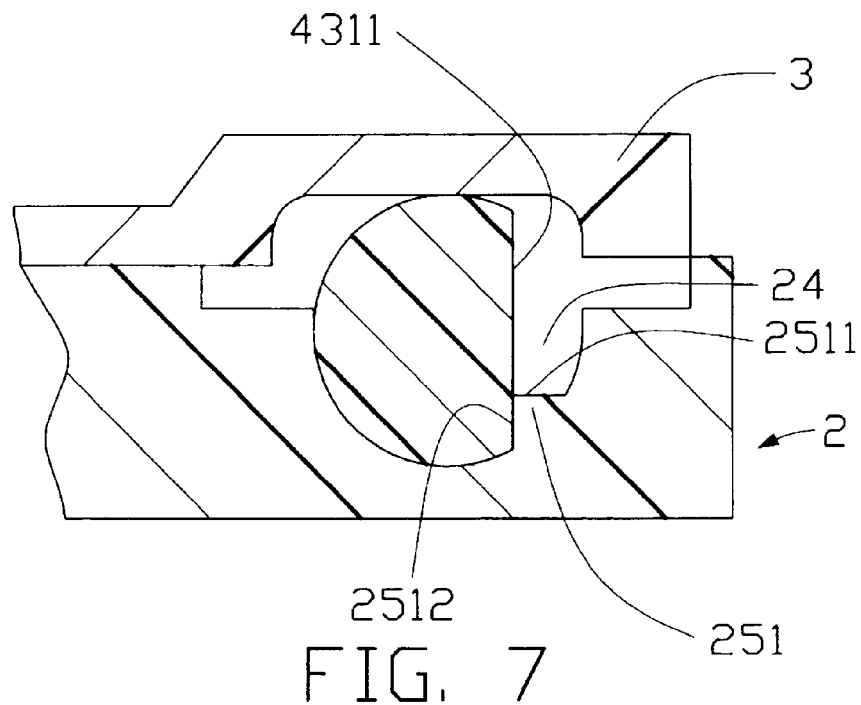
FIG. 7 is a cross-sectional view taken along line V—V of FIG. 4 with the cover at a close state.
Figure 8:
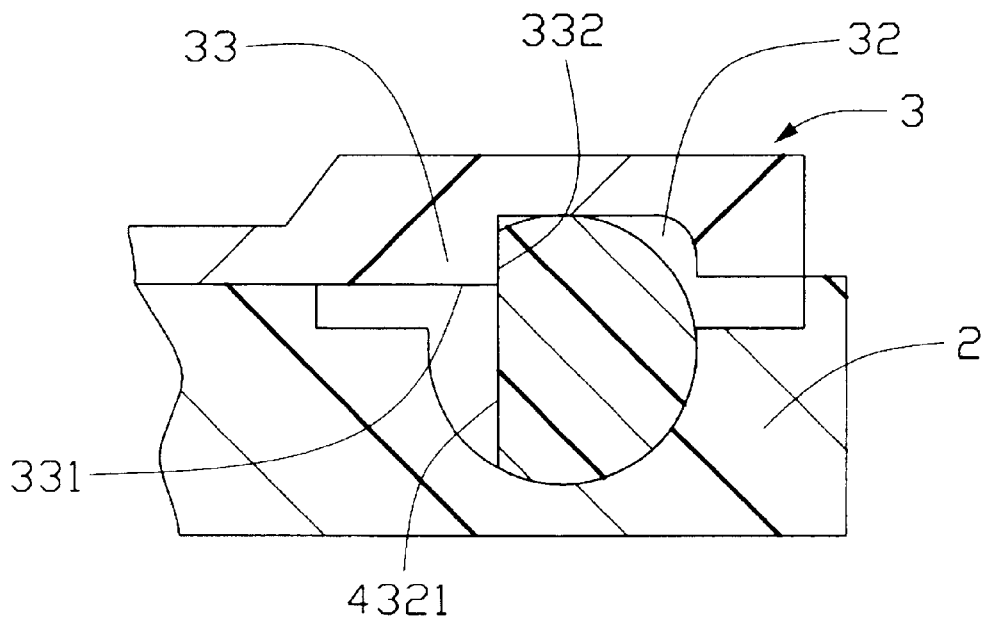
FIG. 8 is a cross-sectional view taken along line VI—VI of FIG. 4 with the cover at a close state.

Referring to FIGS. 7 and 8, the cover 3 is then urged to a close state where the terminals 5 electrically interconnect with the corresponding pins, and where the handle lever 41 is situated at a substantially horizontal position parallel to the cover 3. Simultaneously, the first and second concavity stopper surfaces 4311, 4321 respectively press on the second stopper surfaces 2512 of the first protrusion blocks 251 and the second mating surfaces 332 of the second protrusion blocks 33. The handle lever 41 is prevented from springing back. Therefore damage to the base 2 or the cover 3 is avoided.

It has been shown and described herein that each first protrusion block 251 is configured with first and second stopper surfaces 2511, 2512 perpendicular to each other, and that each second protrusion block 33 is configured with first and second stopper surfaces 331, 332 perpendicular to each other. It should be understood, however, that the first and second protrusion blocks 251, 33 can be alternatively configured to provide similar functionality. Various structures of the first and second protrusion blocks 251, 33 may be adopted, and may be selected according to related features of the connector 1. Moreover, it should been understood that the first and second protrusion blocks 251, 33 can be disposed anywhere in the first and second actuator channels 23, 32 for the purposes of convenient manufacture and assembly, with the first and second concavities 431, 432 respectively corresponding to the first and second protrusion blocks 251, 33 thus disposed.

Although the present invention has been described with reference to a particular embodiment, it is not to be construed as being limited thereto. Various alterations and modifications can be made to the embodiment without in any way departing from the scope or spirit of the present invention as defined in the appended claims.

What is claimed is:

1. A socket connector comprising:
   a base having a terminal receiving section and a first actuator receiving section, the terminal receiving section defining a plurality of terminal-passages;
   a cover slidably mounted on the base, the cover defining a second actuator receiving section;
   a plurality of terminals received in the corresponding terminal-passages; and
   an actuator mechanism including a handle lever, and a shaft received in the first and second actuator receiving sections;
   wherein at least one of the first and second actuator receiving sections defines at least one mating member, the shaft defines at least one mating means to mate with the at least one mating member so as to avoid unduly moving the cover relative to the base, wherein the mating means are first and second concavities defined on the positioning portion of the shaft and further define first and second concavity stopper surfaces parallel to an axis of the shaft.

2. The socket connector of claim 1, wherein the shaft forms cam portions and positioning portions.

3. The socket connector of claim 2, wherein the first actuator receiving section defines a first actuator channel, the first actuator channel defining first cavities and positioning cavities.

4. The socket connector of claim 3, wherein the second actuator receiving section defines a second actuator channel.

5. The socket connector of claim 1, wherein the at least one mating member is first and second protrusion blocks.

6. The socket connector of claim 5, wherein the first protrusion blocks are disposed in the positioning cavities of the base.

7. The socket connector of claim 6, wherein the second protrusion blocks are disposed at one side of the second actuator channel.

8. The socket connector of claim 1, wherein each of the first protrusion blocks defines first and second stopper surfaces both parallel to an axis of the shaft after assembling the connector.

9. The socket connector of claim 8, wherein each of the second protrusion blocks defines first and second mating surfaces parallel to the axis of the shaft after assembling the connector.

10. The socket connector of claim 9, wherein the cover defines a hole section according to the terminal receiving section of the base, the holes section defining a plurality of holes corresponding to the terminal-passages.

11. A socket connector comprising:
    a base defining a first actuator receiving section and a terminal receiving section;
    a cover defining a second actuator receiving section aligned with the first actuator receiving section, and a pin extending section align with the terminal receiving section;
    a plurality of terminals located in said terminal receiving section;
    an actuator mechanism including a handle lever and a shaft received in said first actuator receiving section and said second actuator receiving section;
    said first actuator receiving section defining a first plane and a second plane angled with each other;
    said second actuator receiving section defining a first face and a second face angled with each other;
    said actuator defining a first surface and a second surface angled with each other; wherein
    when said cover is in an open position with regard to the base, said first surface abuts against the first plane and said second surface abuts against the first face;
    when said cover is in a closed position with regard to the base, said first surface abuts against the second plane and said second surface abuts against the second face, wherein said first plane and said first face are parallel to each other, and said second plane and said second face are parallel to each other.

12. The socket of claim 11, wherein said first surface and said second surface are angled with each other at 90 degrees.

13. The socket of claim 11, wherein said first plane and said second plane are angled with each other at 90 degrees.

14. The socket of claim 11, wherein said first face and said second face are angled with each other at 90 degrees.

15. A socket connector comprising:
    a base defining a first actuator receiving section and a terminal receiving section;
    a cover defining a second actuator receiving section vertically aligned with the first actuator receiving section, and a pin extending section vertically aligned with the terminal receiving section;
    a plurality of terminals located in said terminal receiving section;
    an actuator mechanism including a handle lever and a shaft received in said first actuator receiving section and said second actuator receiving section; and
    said first actuator receiving section defining a first plane and a second plane angled with each other and facing the shaft clockwise and counterclockwise respectively; wherein
    said shaft defines a first portion abutting against the first plane when said cover is in an open position relative to the base; said shaft defines a second portion abutting against the second plane when said cover is in a closed position relative to the base, wherein said first plane and said second plane are angled with each other at 90 degrees.

16. The socket of claim 15, wherein said first portion and said second portion are located at a same axial position along said shaft.

17. The socket of claim 15, wherein said first portion and said second portion are located on a same plane.

* * * * *